United States Patent [19]

Matloubian

[11] Patent Number: 5,399,519

[45] Date of Patent: * Mar. 21, 1995

[54] METHOD OF MANUFACTURING SEMICONDUCTOR ON INSULATOR TRANSISTOR WITH COMPLEMENTARY TRANSISTOR COUPLED TO THE CHANNEL

[75] Inventor: Mishel Matloubian, Dallas, Tex.

[73] Assignee: Texas Instruments Incorporated, Dallas, Tex.

[*] Notice: The portion of the term of this patent subsequent to Mar. 10, 2009 has been disclaimed.

[21] Appl. No.: 76,599

[22] Filed: Jun. 14, 1993

Related U.S. Application Data

[60] Division of Ser. No. 665,925, Mar. 5, 1991, Pat. No. 5,283,457, which is a continuation of Ser. No. 416,189, Oct. 2, 1989, abandoned.

[51] Int. Cl.$^6$ .................................. H01L 21/335
[52] U.S. Cl. ........................... 437/57; 437/45; 437/913
[58] Field of Search ................. 257/351, 369, 401; 437/34, 913, 21, 56, 45, 57

[56] References Cited

U.S. PATENT DOCUMENTS

| | | | |
|---|---|---|---|
| 4,231,055 | 10/1980 | Iizuka | 357/42 |
| 4,300,061 | 11/1981 | Mihalich et al. | 307/297 |
| 4,330,849 | 5/1982 | Togei et al. | 365/181 |
| 4,384,300 | 5/1983 | Iizuka | 357/42 |
| 4,395,726 | 7/1983 | Maeguchi | 357/41 |
| 4,872,042 | 10/1989 | Maeda et al. | 357/23.6 |
| 4,996,575 | 2/1991 | Ipri et al. | 357/23.7 |
| 5,095,348 | 3/1992 | Houston | 357/23.7 |
| 5,185,535 | 2/1993 | Farb et al. | 257/351 |
| 5,275,964 | 1/1994 | Hayden | 437/48 |

FOREIGN PATENT DOCUMENTS

| | | | |
|---|---|---|---|
| 57-201066 | 12/1982 | Japan | 357/23.14 |
| 58-094191 | 6/1983 | Japan . | |
| 62-35559 | 2/1987 | Japan | 357/45 |

Primary Examiner—George Fourson
Assistant Examiner—David Mason
Attorney, Agent, or Firm—Ira S. Matsil; James C. Kesterson; Richard L. Donaldson

[57] ABSTRACT

The described embodiments of the present invention provide a method and structure for actively controlling the voltage applied to the channel of field effect transistors. In the described embodiments, a transistor connected to the channel region is fabricated. The channel transistor has opposite conductivity type to the transistor using the main channel region. The source of the channel transistor is connected to the channel and the drain of the channel transistor is connected to a reference voltage. The same gate is used to control the channel transistor and the main transistor. When a voltage which causes the main transistor to be on is applied, the channel transistor is off, thus allowing the channel to float and allowing higher drive current. On the other hand, when a voltage to turn off the main transistor is applied, the channel transistor is turned on, thus clamping the channel region to the reference voltage. This allows for consistent threshold voltage control of the main transistor. In a preferred embodiment, the channel of the main transistor is used as the source of the channel transistor and the gate of the main transistor extends onto the channel region of the channel transistor. The reference voltage is then connected to the drain region which is formed on the opposite side of the channel transistor channel region from the main transistor's channel.

22 Claims, 10 Drawing Sheets

METHOD OF MANUFACTURING SEMICONDUCTOR ON INSULATOR TRANSISTOR WITH COMPLEMENTARY TRANSISTOR COUPLED TO THE CHANNEL

This is a division of application Ser. No. 07/665,925, filed Mar. 5, 1991. now U.S. Pat No. 5,283,457 issued Feb. 1, 1994, which is a continuation of application Ser. No. 07/416,189, filed Oct. 2, 1989, and now abandoned.

FIELD OF THE INVENTION

The present invention relates to the field of integrated circuit fabrication. More specifically, the present invention relates to the field of transistor fabrication in semiconductor-on-insulator structures.

BACKGROUND OF THE INVENTION

Semiconductor-on-insulator structures are often used in applications where resistance to radiation effects on integrated circuits are required. Semiconductor-on-insulator structures include a layer of single crystal semiconductor, usually silicon, formed on an insulating structure such as sapphire or silicon dioxide. The single crystal layer is usually divided into separate regions or mesas to provide complete electrical isolation between the components formed in a mesa and components formed in other mesas. Semiconductor-on-insulator structures owe their robustness to radiation effects to the isolation of the electrical devices from the substrate. When a radiation particle, such as an alpha particle strikes a normal integrated circuit, the interaction between the electrical device and the substrate can cause errors in the operation of the integrated circuit. With semiconductor-on-insulator structures, this interaction is prevented by the insulating layer.

One problem presented by the use of semiconductor-on-insulator structures is the body effect on the channel of field effect transistors. Field effect transistors operate by coupling a voltage to a channel region which causes conduction between source and drain regions. The point at which the conduction between the source and drain occurs is called the threshold voltage. Because the channel is formed in an insulated structure, trapped charge can cause variations in the threshold voltage and thus inconsistencies in the operation of the field effect transistor, including uncontrolled turn on (conduction). It is common practice to provide a ground contact to the channel to prevent these effects. However, the effects of a floating channel region are not entirely negative. For example, a floating channel region can provide higher drive current through the channel region. This provides for faster operation of integrated circuits using transistors with higher drive currents. The present invention is directed to providing a structure and method to allow for a floating channel region during the "on" condition of the transistor when the higher drive current is useful and to provide a control voltage on the channel when the transistor is to be off to provide consistent threshold control.

SUMMARY OF THE INVENTION

The described embodiments of the present invention provide a method and structure for actively controlling the voltage applied to the channel of field effect transistors. In the described embodiments, a transistor connected to the channel region is fabricated. The channel transistor has opposite conductivity type to the transistor using the main channel region. The source of the channel transistor is connected to the channel and the drain of the channel transistor is connected to a reference voltage. The same gate is used to control the channel transistor and the main transistor. When a voltage which causes the main transistor to be on (conductive) is applied, the channel transistor is off (nonconductive), thus allowing the channel to float and allowing higher drive current. On the other hand, when a voltage to turn off the main transistor is applied, the channel transistor is turned on, thus clamping the channel region to the reference voltage. This allows for consistent threshold voltage control of the main transistor.

In a preferred embodiment, the channel of the main transistor is used as the source of the channel transistor and the gate of the main transistor extends onto the channel region of the channel transistor. The reference voltage is then connected to the drain region which is formed on the opposite side of the channel transistor channel region from the main transistor's channel.

DETAILED DESCRIPTION

Figure 1:
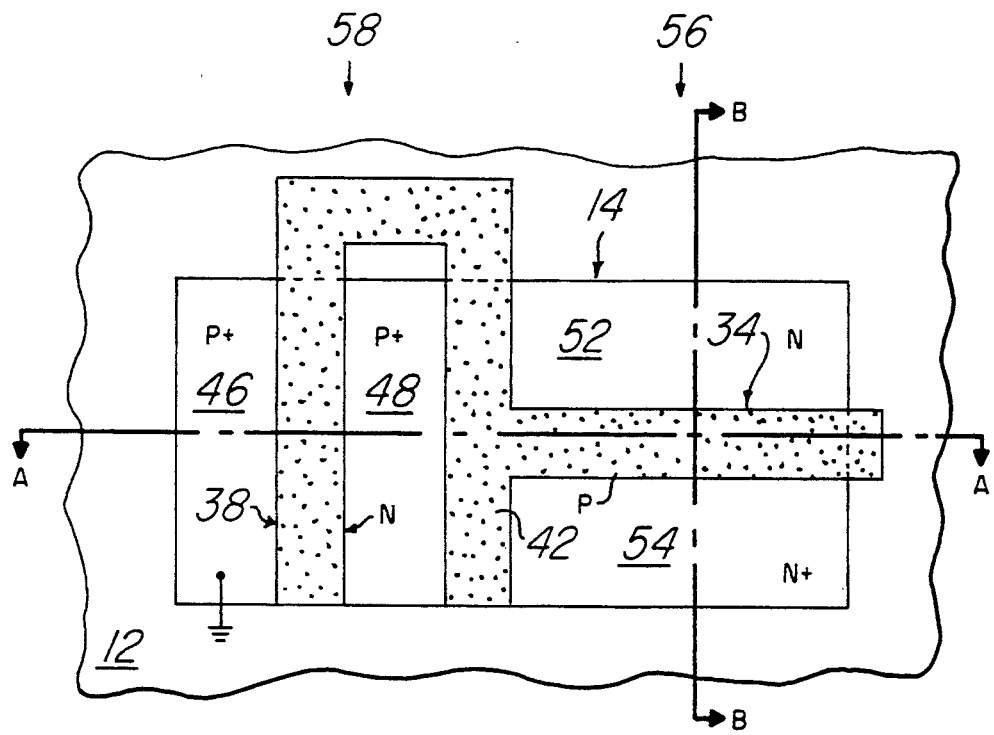
FIG. 1 is a plan view diagram of one embodiment of the present invention.
Figure 2:
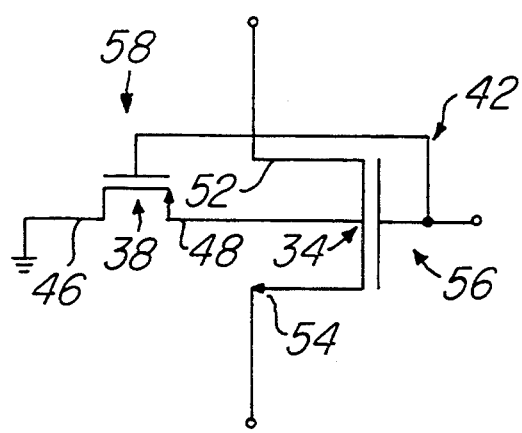
FIG. 2 is an electrical schematic diagram showing the operation of the structure shown in FIG. 1.
Figure 3A:
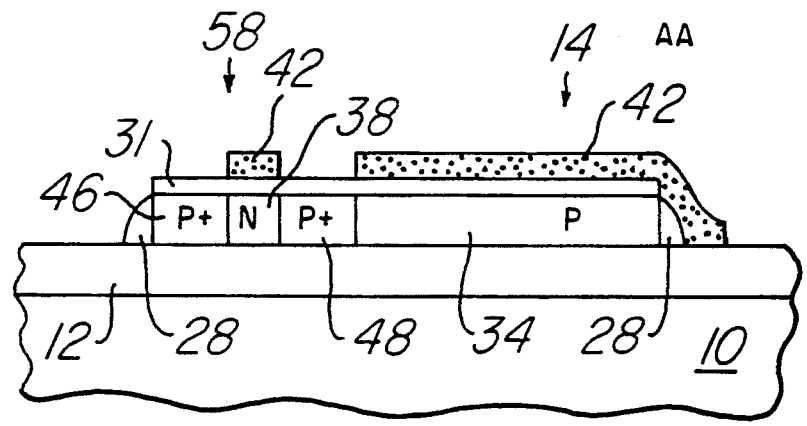
FIGS. 3A and 3B are section diagrams of sections AA and sections BB, respectively, of FIG. 1.
Figure 3B:
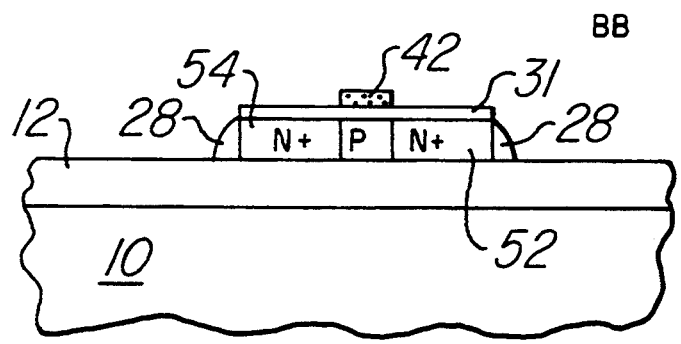

FIG. 1 is a plan view diagram of one embodiment of the present invention. FIG. 2 is an electrical schematic diagram showing the operation of the embodiment shown in FIG. 1. FIGS. 3A and 3B are section diagrams of the embodiment shown in FIG. 1. FIGS. 4A through 4K are side view schematic diagrams showing the fabrication of the embodiment shown in FIG. 1.

The embodiment shown in FIG. 1 comprises two merged transistors. The first transistor is the main transistor 56 and the second transistor is the body or channel transistor 58. This structure is formed in mesa 14 on insulating layer 12. Insulating layer 12 may be silicon dioxide, sapphire or any number of insulating structures known in the art. Gate 42 controls the current between source 54 and drain 52 of main transistor 56. Source 54 and drain 52 are connected to other devices in the integrated circuit containing the present embodiment of the invention to provide the function of a field effect transistor. Gate 42 controls the current through channel region 34 thus providing the control of the current from drain 52 to source 54. Channel region 34 is a p-type region which is self-aligned to gate 42. P+ source region 48 is electrically connected to channel region 34 by virtue of their similar conductivity types. N-channel 38 is controlled by gate 42, which in turn controls the current between drain region 48 and source region 46. These components comprise body transistor 58. Source region 46 is generally connected to a reference potential to provide a fixed voltage to channel region 34 when body transistor 58 is on. The structure of FIG. 1 is designed so that when transistor 56 is on, channel region 34 is allowed to float and thus increased drive current is available for the circuit including transistor 56. When transistor 56 is off, channel region 34 is connected to a reference potential so that a consistent threshold voltage is available for predictable, accurate operation of transistor 56 in the circuitry containing transistor 56.

FIG. 2 is an electrical schematic diagram showing the electrical operation of the structure of FIG. 1. Source region 54 and drain region 52 are connected to other devices in the integrated circuit. Gate 42 controls both transistor 56 and transistor 58. Drain region 48 is connected to channel 34 of transistor 56. Source region 46 is connected a reference potential. Transistor 56, in this embodiment, is an n-channel transistor and transistor 58 is a p-channel transistor. When a high voltage is applied to gate 42, transistor 58 is off and transistor 56 is on. Thus, the channel region is allowed to float on transistor 56. When a low voltage is applied to gate 42, transistor 58 is on and transistor 56 is off. Because transistor 58 is on, the voltage level on channel region 34 is controlled by the reference potential connected to source region 46.

FIGS. 3A and 3B are cross-sectional diagrams along section lines AA and BB, respectively, of FIG. 1. As can be seen from FIG. 3A, insulator layer 12 is formed on the surface of substrate 10. In this particular embodiment, substrate 10 is a crystalline silicon substrate and insulating layer 12 is a layer of silicon dioxide formed by the implanted oxygen method. Descriptions of the implanted oxygen method (SIMOX) may be found in U.S. Pat. Nos. 3,855,009 and 4,241,359. Sidewall oxide regions 28 are provided on the sidewalls of mesa 14 to stabilize the conduction at the surface of the edge of the mesa. Gate 42 is insulated from channel regions 34 and 38 by silicon dioxide layer 30. Gate 42 controls the conductivity between drain region 48 and source region 46 as shown in FIG. 3A. Gate region 42 also controls the conductivity between source region 54 and drain region 52 as shown in FIG. 3B.

FIGS. 4A through 4K are side view schematic diagrams corresponding to the view provided by FIG. 3A showing the processing steps necessary for the fabrication of the embodiment shown therein. Crystalline silicon substrate 10 is implanted with oxygen ions and annealed to form insulating layer 12. Epitaxial layer 14 is then formed on the surface of the remaining structure using the single crystal silicon structure remaining above silicon dioxide layer 12 for nucleation sites. Substrate 10 and thus, subsequently, epitaxial layer 14 may be n or p-type layers using a 100 crystalographic orientation. The doping concentration is generally on the order of 3 to 6 ohm centimeters for n-type and 10 to 12 ohm centimeters for p-type. The process described herein assumes epitaxial layer 14 is n type.

A layer of silicon dioxide 16 is then grown to a thickness of approximately 350 Angstroms using thermal oxidation techniques. A layer of silicon nitride 18 is then deposited by low pressure chemical vapor deposition to a thickness of approximately 1,700 Angstroms. A layer of silicon dioxide 20 is then deposited on the surface of silicon nitride layer 18 to a thickness of approximately 3,200 Angstroms using low pressure chemical vapor deposition. A layer of photoresist 22 is then deposited on the surface of silicon dioxide layer 20. Using known lithographic techniques, photoresist layer 22 is optically exposed and patterned. Using photoresist layer 22 as an etch mask, silicon dioxide layer 20, silicon nitride layer 18 and silicon dioxide layer 16 are etched. Layers 16,18 and 20 are etched using reactive ion etching techniques known in the art to provide anisotropic etching properties.

Figure 4A:
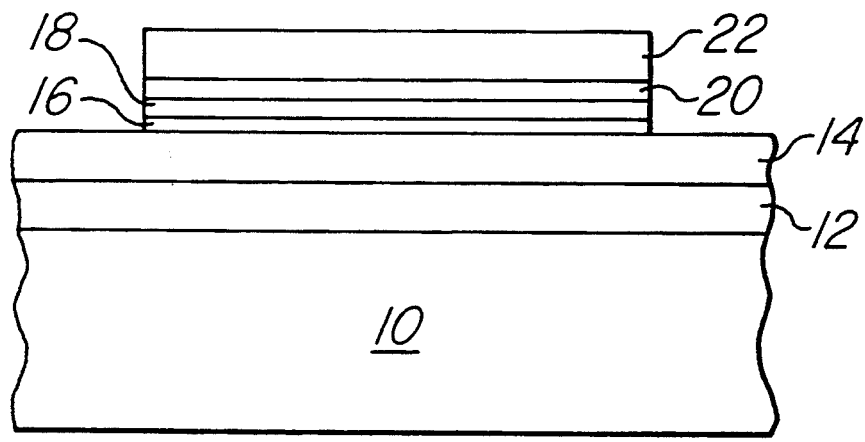
FIGS. 4A through 4K are side view schematic diagrams showing the processing steps necessary for fabricating the embodiment shown in FIG. 1.
Figure 4B:
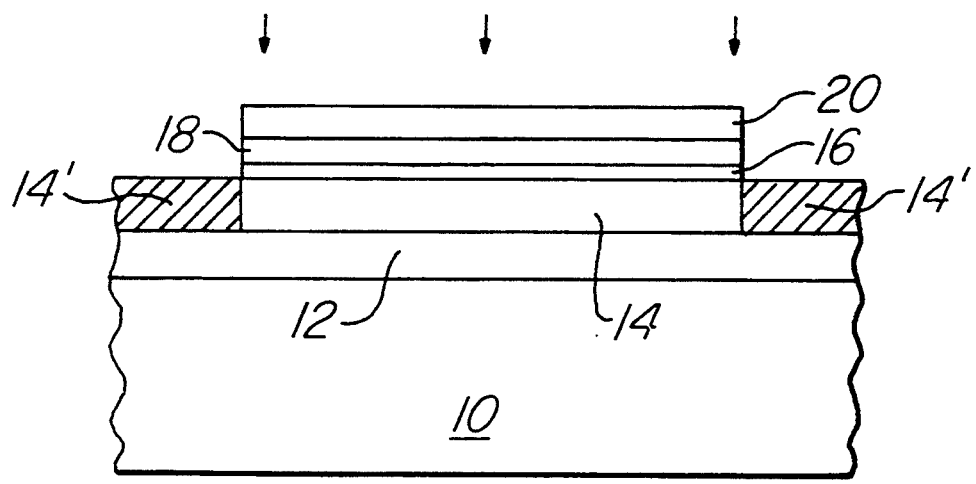
Figure 4C:
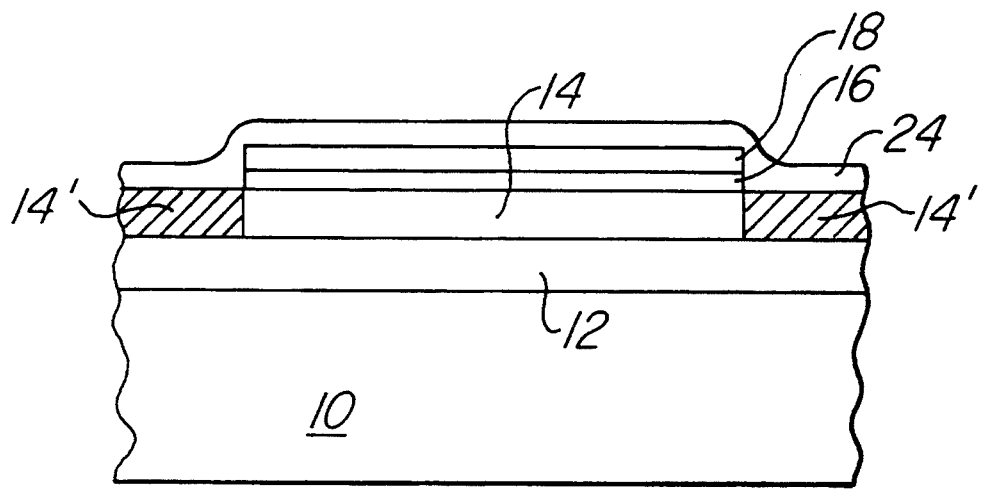
Figure 4D:
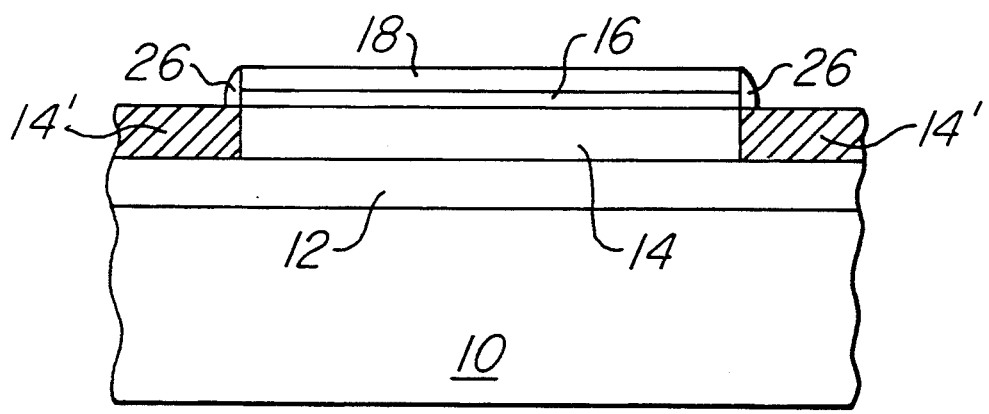
Figure 4E:
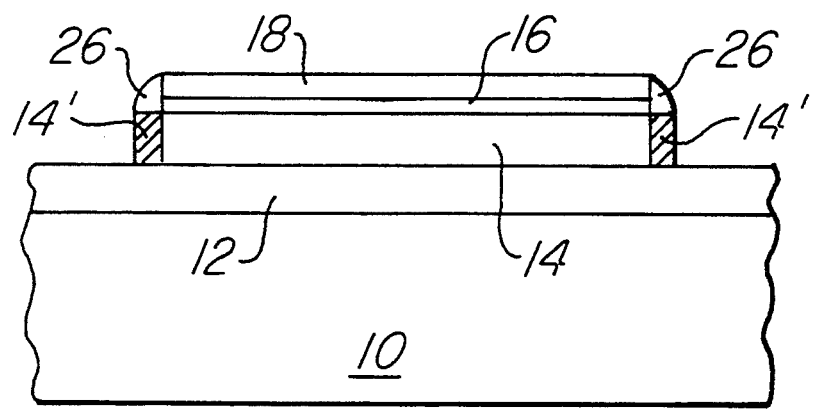
Figure 4F:
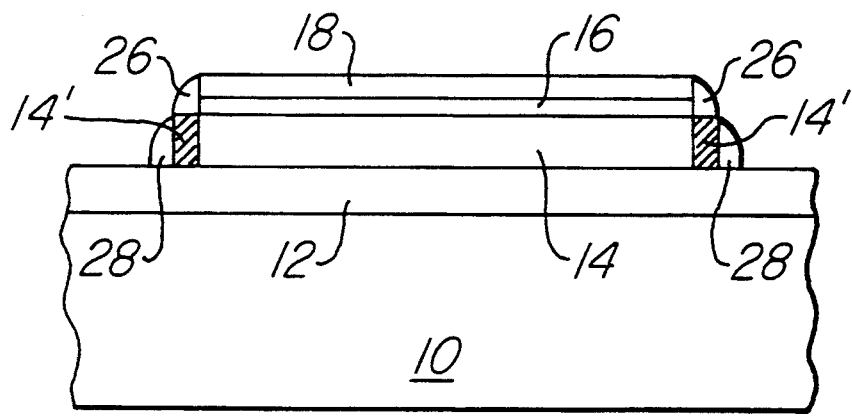

Photoresist layer 22 is then removed using common wet removal techniques. The structure of FIG. 4B is then subjected to an ion implantation using two steps. The first step is implantation of boron ions having an energy of approximately 30 kiloelectron volts and a density of approximately $3 \times 10^{12}$ ions/centimeter$^2$. The second step uses boron ions at an energy of approximately 80 kiloelectron volts and a density of approximately $5 \times 10^{12}$ ions/centimeter$^2$. This forms channel stop regions 14' as shown in FIG. 4B. Silicon dioxide layer 20 is then removed using any of a number of etching techniques such as a wet deglaze using hydrofluoric acid. A layer of silicon dioxide 24 is then deposited using low pressure chemical vapor deposition to a thickness of approximately 1,000 Angstroms. Silicon dioxide layer 24 is then etched using an anisotropic etching process, such as reactive ion etching using a fluorine based chemistry (such as carbon tetrafluoride), to provide sidewall oxide regions 26 as shown in FIG. 4D. Silicon nitride layer 18, silicon dioxide layer 16 and silicon sidewall oxide layers 26 are then used as an etch mask for the etching of epitaxial silicon layer 14. Epitaxial silicon layer 14 is etched using reactive ion etching using hydrochloric acid to provide the structure of FIG. 4E. FIG. 4E includes sidewall passivating layers 14' which prevent unwanted conduction along the edges of mesa 14. The formation of such sidewall passivating layers is shown in Matloubian, U.S. Pat. No. 4,753,896, issued Jun. 28, 1988 and assigned to the assignee of this application. The structure of FIG. 4E is then subjected to oxidation to provide approximately 250 Angstroms of silicon dioxide on the sidewalls of mesa 14. A further layer of low pressure chemical vapor deposited silicon dioxide having a thickness of approximately 2,500 Angstroms is deposited and reactive ion etched to provide sidewall silicon dioxide layers 28 as shown in FIG. 4F. In subsequent diagrams, passivation regions 14' are omitted for clarity of the drawings.

Figure 4G:
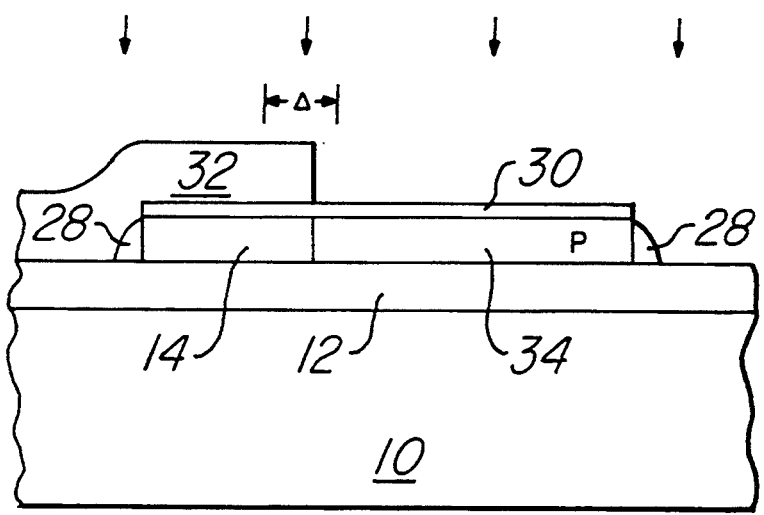

Silicon nitride layer 18, silicon dioxide layer 16 and sidewall regions 26 are removed using a two-step process of etching using hot phosphoric acid to remove silicon nitride layer 18 and anisotropic etching in a fluorine based chemistry to remove silicon dioxide layer 16 and sidewall silicon dioxide layers 26. Because of the anisotropy of reactive ion etching, silicon dioxide layers 28 will remain. A layer of silicon dioxide 30 is then grown by thermal oxidation of the surface of mesa region 14 to provide silicon dioxide layer 30 as shown in FIG. 4G. A photoresist layer 32 is then deposited and patterned using common photolithographic techniques to provide the structure of photoresist layer 32, as shown in FIG. 4G. The structure of FIG. 4G is then subjected to a first ion implantation of boron ions at an energy of approximately 80 kiloelectron volts and a density of approximately $3.5 \times 10^{12}$ ions/centimeter$^2$. This sets the back threshold voltage of p region 34 to a voltage in excess of 25 volts. The front threshold voltage of p region 34 may then be adjusted using an ion implantation of boron ions at an energy of approximately 25 kiloelectron volts and a density selected to provide the selected threshold voltage. The edge of photoresist layer 32 is selected to fit in the region $\Delta$ which is an overlap region where p+drain region 48 will be formed. Because p+ region 48 will be formed in this area, the alignment of photoresist layer 32 within the region $\Delta$ is not critical.

Figure 4H:
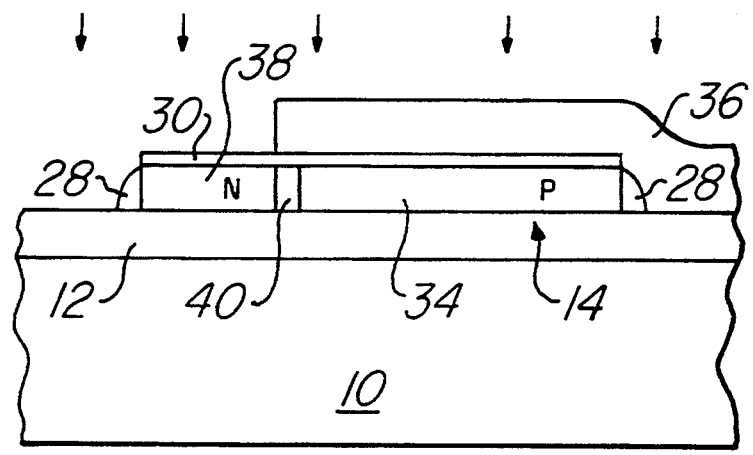
Figure 4I:
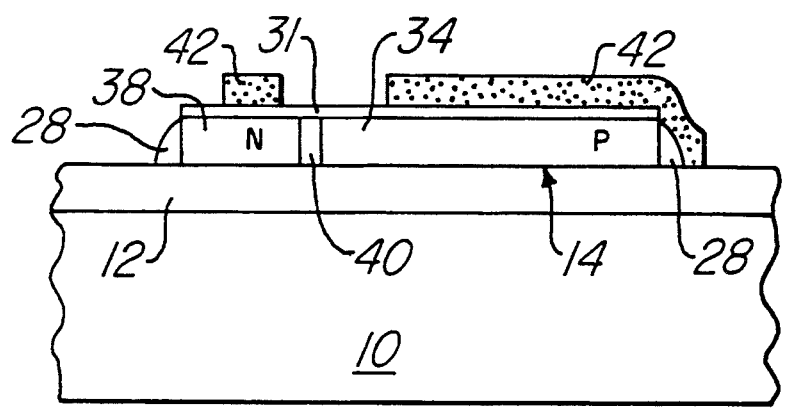

Photoresist layer 32 is then removed and a second photoresist layer 36 is deposited and patterned as shown in FIG. 4H. The structure of FIG. 4H is then subjected to an ion implantation of boron having an energy of approximately 25 kiloelectron volts and a density of approximately $1.0 \times 10^{12}$ ions/centimeter$^2$. This sets the front threshold voltage at approximately $-1$ volt. A second implantation of phosphorous ions having an energy of approximately 180 kiloelectron volts and a density of approximately $1.2 \times 10^{12}$ ions/centimeter$^2$ is then performed to set the back threshold voltage at approximately $-13$ volts. As is well known in the art, the energies and densities of these ion implantations may be selected to provide particular characteristics desirable in particular circumstances. In the structure shown in FIG. 4H, this ion implantation leaves a gap 40 between n-channel region 38 and p-channel region 34. This is a region within the region $\Delta$ as shown in FIG. 4G and n-channel region 38 and p-channel region 34 may provide a gap as shown in FIG. 4H or may overlap without adverse effects on the operation of the integrated circuit.

Figure 4J:
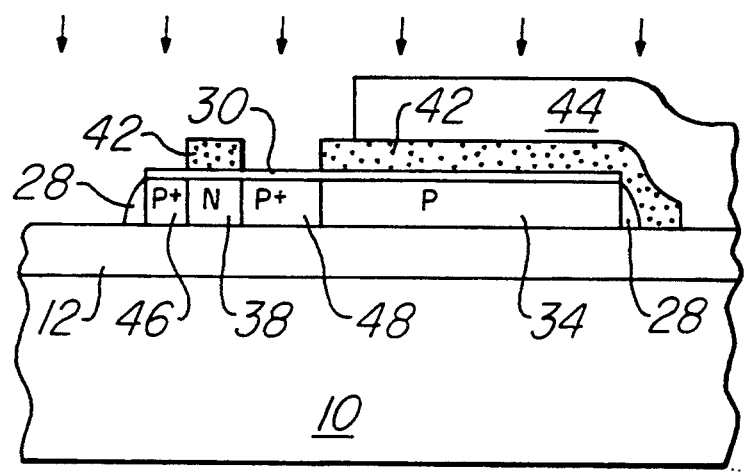
Figure 4K:
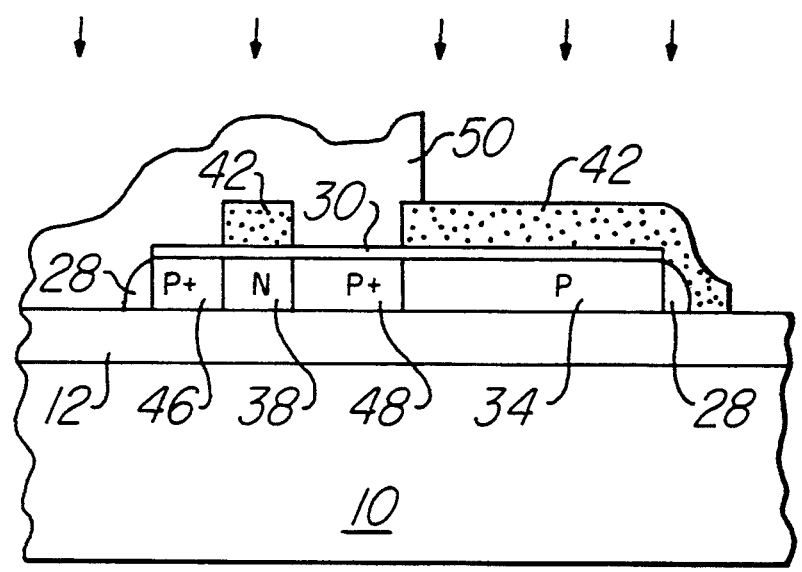

Photoresist layer 36 is then removed and silicon dioxide layer 30 is stripped and a second silicon dioxide layer 31 is formed to a thickness of approximately 250 Angstroms using thermal oxidation. A layer of polycrystalline silicon 42 is then deposited to a thickness of approximately 4,500 Angstroms and patterned to provide the structure shown in FIG. 4I. A layer of photoresist 44 is then deposited and patterned as shown in FIG. 4J. The structure of FIG. 4J is then subjected to an ion implantation of boron ions having an energy of approximately 20 kiloelectron volts and a density of approximately $2 \times 10^{15}$ ions/centimeter$^2$. This ion implantation forms source region 48 and drain region 56 as shown in FIG. 4J. Photoresist layer 44 is then removed and photoresist layer 50 is deposited on the surface of the structure as shown in FIG. 4K. The structure of FIG. 4K is then subjected to an ion implantation of phosphorous ions having an energy of approximately 140 kiloelectron volts and a density of approximately $5 \times 10^{14}$ ions/centimeter$^2$ and a second ion implantation of arsenic ions having an energy of approximately 150 kiloelectron volts and a density of approximately $3.5 \times 10^{15}$ ions/centimeter$^2$. These ion implantations form source region 54 and drain region 52 as shown in FIG. 1. Thus, the embodiment shown in FIG. 1 is fabricated.

Figure 5:
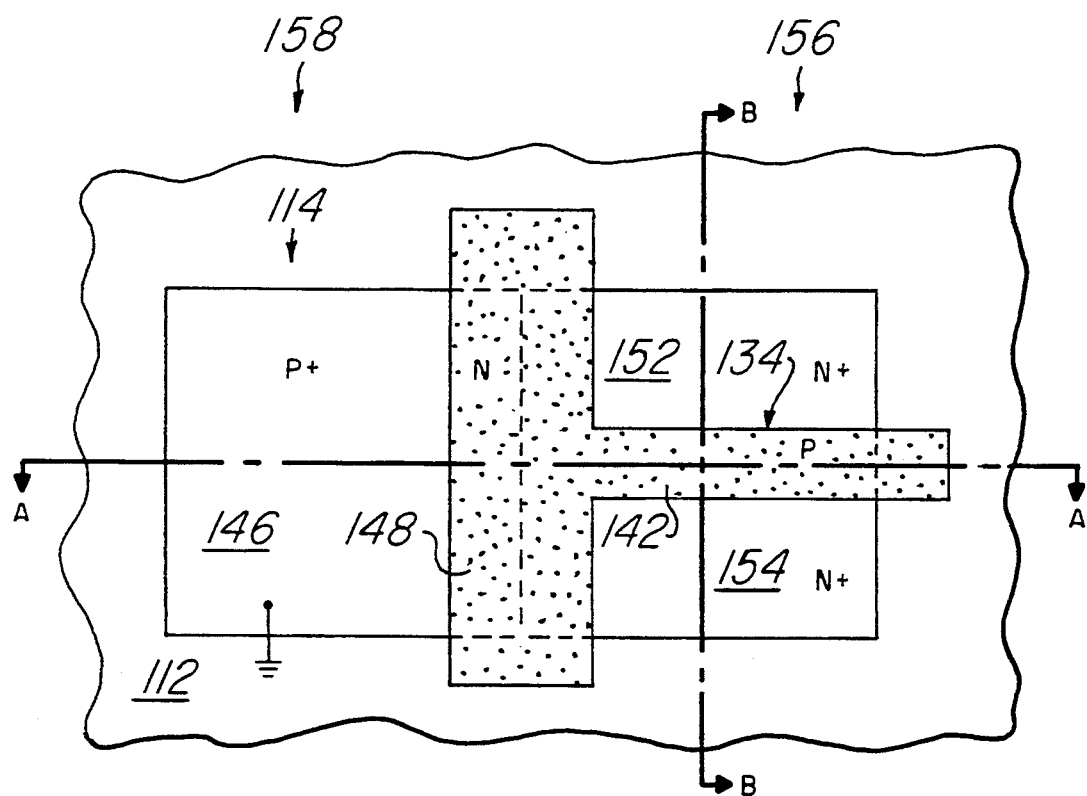
FIG. 5 is a plan view diagram of a preferred embodiment of the present invention.
Figure 6:
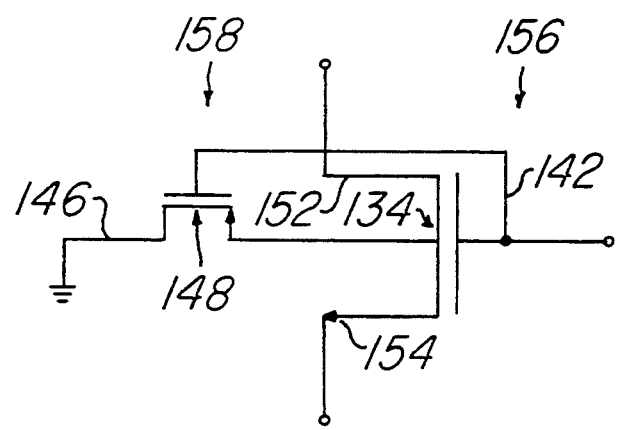
FIG. 6 is an electrical schematic diagram showing the electrical operation of the embodiment shown in FIG. 5.
Figure 7A:
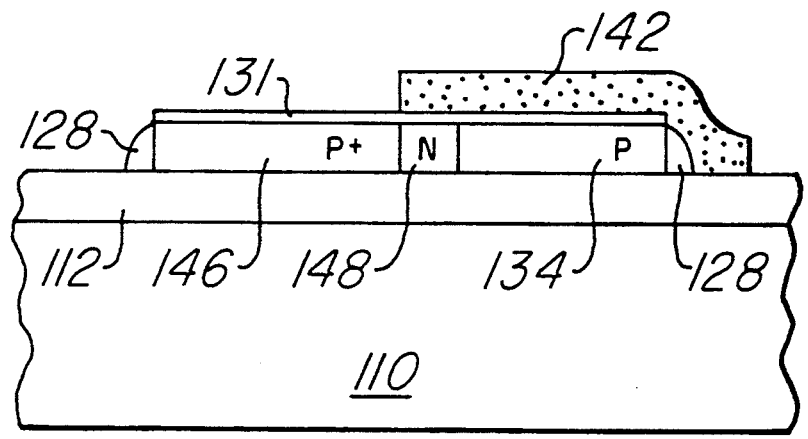
FIGS. 7A and 7B are section diagrams along sections AA and BB, respectively, of FIG. 5.
Figure 7B:
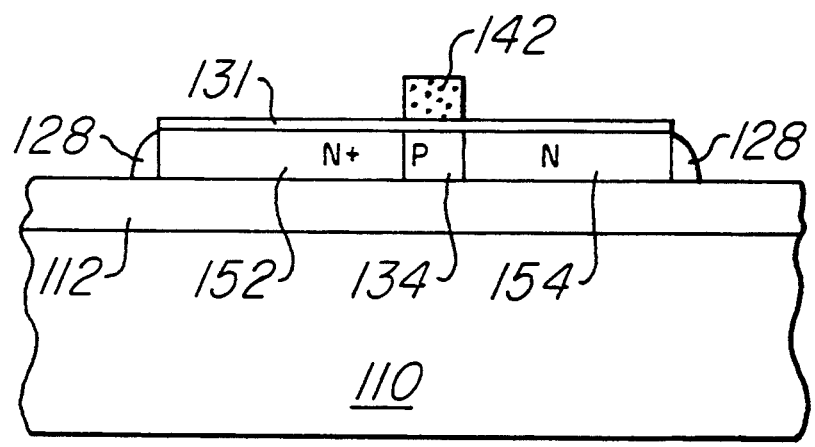
Figure 8A:
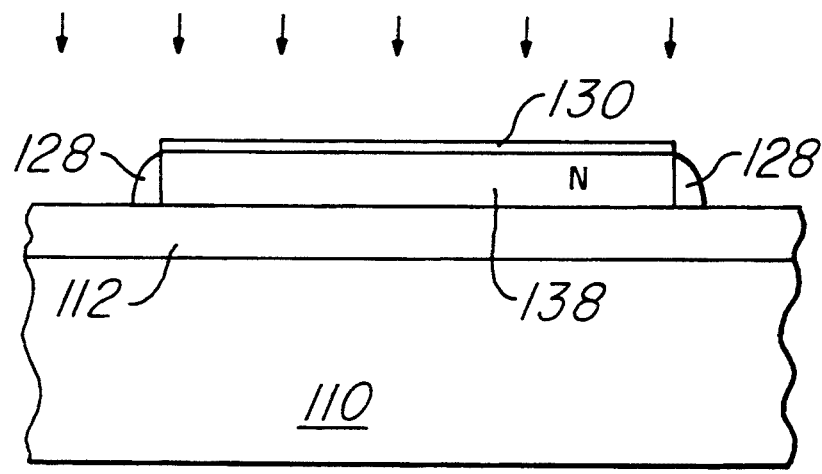
FIGS. 8A through 8D are side view schematic diagrams showing the processing steps necessary to fabricate the embodiment shown in FIG. 5.
Figure 8B:
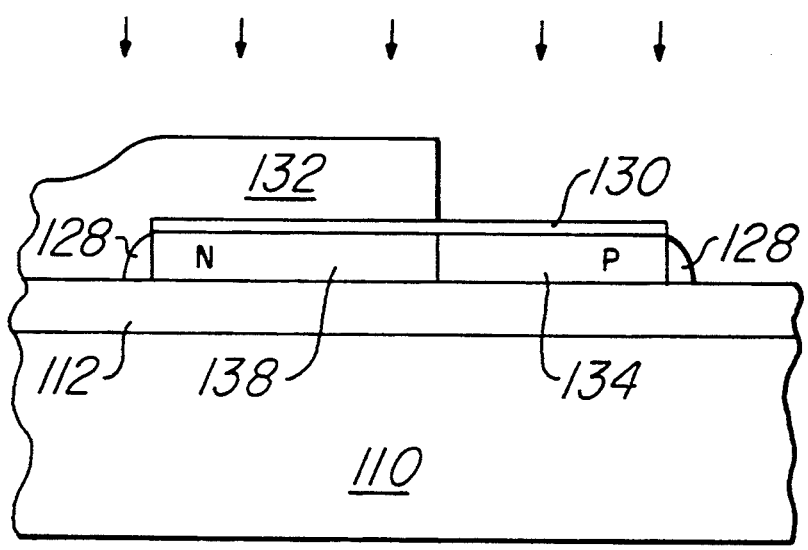

A second preferred embodiment is shown in plan view in FIG 5. An electrical schematic of the operation of the embodiment shown in FIG. 5 is shown in FIG. 6. Cross-sectional diagrams along sections AA and BB are shown in FIG. 7A and 7B, respectively. The fabrication steps necessary to fabricate the embodiment shown in FIG. 5 are shown in FIGS. 8A through 8B.

The embodiment of FIG. 5 includes two transistors, a main transistor 156 and a body transistor 158. In the main transistor 156, gate 142 controls current between source 154 and drain 152. This is controlled by controlling the conductivity of channel region 134. Channel region 134 abuts n-channel region 148. P-channel region 134 serves as the source and p+ region 146 serves as the drain of body transistor 158. Conductivity between p-channel region 134 and p+ drain 146 is controlled by gate 142 by controlling the conductivity of n-channel region 148. This comprises body transistor 158.

An electrical schematic diagram of the structure of FIG. 5 is shown in FIG. 6. Gate 142 controls the conductivity of n-channel transistor 156 and p-channel transistor 158. When a high voltage signal is applied to gate 142, p-channel transistor 158 is off and n-channel transistor 156 is on. Because p-channel transistor 158 is off, channel region 134 is allowed to float and maximum drive current is provided by transistor 156. When a low voltage signal is applied to gate 142, p-channel transistor 158 is on and n-channel transistor 156 is off. Because p-channel transistor 158 is on, channel region 134 is tied to a reference potential and a consistent threshold voltage and controllable on/off characteristics are provided by transistor 156.

FIGS. 7A and 7B are cross-sectional diagrams of cross sections AA and BB, respectively, of FIG. 5. As can be seen in FIG. 7A, gate 142 controls the conductivity of channel region 148 and thus the conductivity between p region 134 and p+ region 146. As can be seen from FIG. 7B, gate 142 also controls the conductivity of p region 134 which controls the conductivity between source region 152 and drain region 154.

FIG. 8A is a side view schematic diagram showing an intermediate processing step for fabricating an embodiment shown in FIG. 5. FIG. 8A corresponds to the step in the procedure shown in FIG. 4G and the steps used to fabricate the structures shown in FIG. 4G are also used to fabricate the structures shown in FIG. 8A where the reference numeral plus 100 from FIG. 4G is used as a reference numeral to corresponding components in FIG. 8A (for example, sidewall oxide regions 128 correspond to sidewall oxide regions 28 in FIG. 4G).

The structure of FIG. 8A is subjected to a first ion implantation of phosphorous ions having an energy of approximately 180 kiloelectron volts and a density of approximately $1.2 \times 10^{12}$ ions/centimeter$^2$. This adjusts the back threshold voltage and in part adjusts the front threshold voltage. The front threshold voltage is then further adjusted by an ion implantation of boron ions having an energy of approximately 25 kiloelectron volts and a density of approximately $1.45 \times 10^{12}$ ions/centimeter$^2$. A layer of photoresist 132 is then deposited and patterned, as shown in FIG. 8B. The structure of FIG. 8B is then subjected to an ion implantation of boron ions having an energy of approximately 85 kiloelectron volts and a density of approximately $3.7 \times 10^{12}$ ions/centimeter$^2$. This counterdopes the back threshold implantation used to form n region 138. An additional ion implantation of boron having an energy of 25 kiloelectron volts may be performed to adjust the front threshold voltage of p region 134 using a density selected to produce the desired threshold voltage. Photoresist layer 132 is then removed as is silicon dioxide layer 130. Silicon dioxide layer 130 is removed using any one of numerous silicon dioxide etching techniques such as reactive ion etching in a fluorine base chemistry.

Figure 8C:
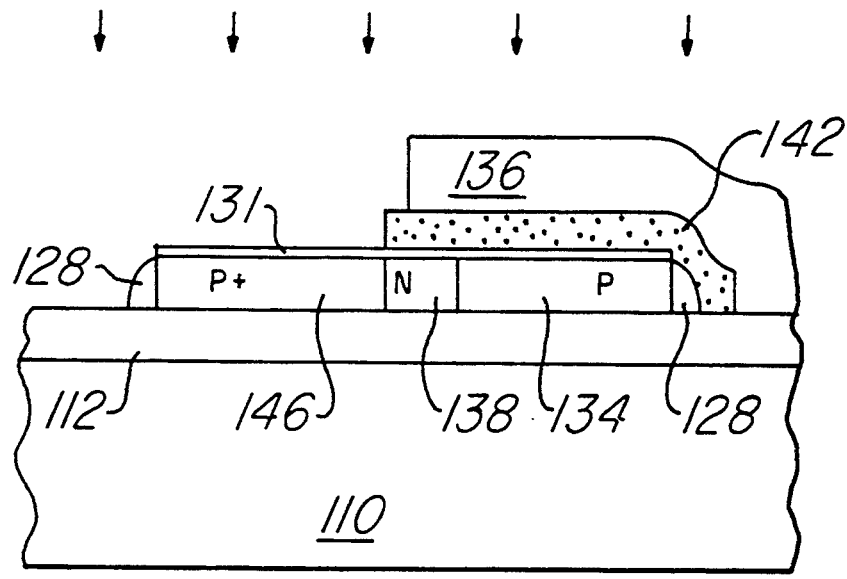
Figure 8D:
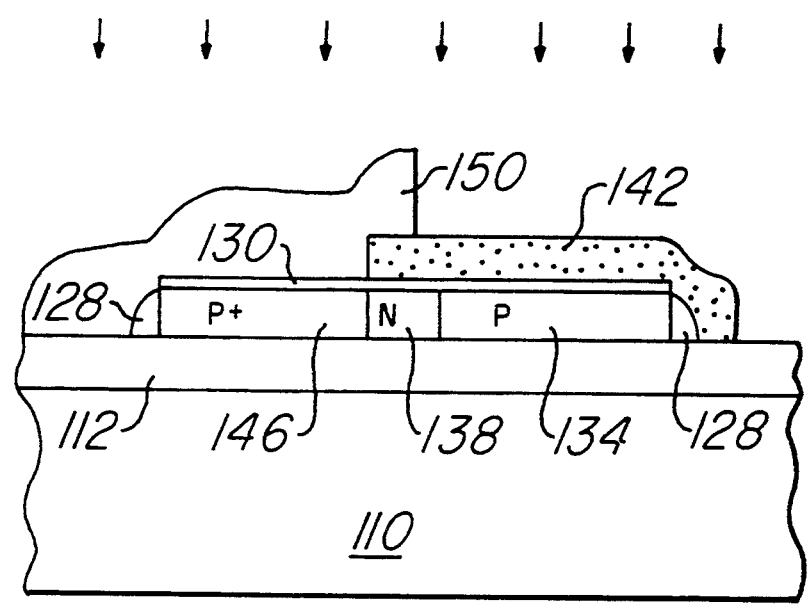

A gate oxide is then thermally grown using thermal oxidation to a thickness of approximately 250 Angstroms, as shown in FIG. 8C. A layer of polycrystalline silicon 142 is then deposited and patterned, as shown in FIG. 8C. A layer of photoresist 136 is then deposited on the surface of patterned layer 142 and patterned to provide the structure shown in FIG. 8C. The structure of FIG. 8C is then subjected to an ion implantation of boron ions having an energy of approximately 20 kiloelectron volts and a density of approximately $2 \times 10^{15}$ ions/centimeter$^2$ to form p+ region 146, as shown in FIG. 8C. Photoresist layer 136 is then removed and photoresist layer 150 is deposited and patterned as shown in FIG. 8D. The structure of FIG. 8D is then subjected to an ion implantation of phosphorous ions having an energy of approximately 140 kiloelectron volts and a density of approximately $5 \times 10^{14}$ ions/centimeter$^2$ and a second ion implantation of arsenic ions having an energy of approximately 150 kiloelectron volts and a density of approximately $3.5 \times 10^{15}$ ions/centimeter$^2$ to form n+ source and drain regions 154 and 152, as shown in FIG. 5.

Although specific embodiments of the present invention are herein described, they are not to be construed as limiting the scope of the invention. Numerous modifications to the present invention will become obvious to those skilled in the art in light of this specification. For example, to provide transistors having opposite conductivity characteristics, regions of opposite conductivity to those shown in the specification may be used. In addition, the structures herein used may find applicability in structures other than silicon-on-insulator structures. For example, when field effect transistors are formed in isolated wells in BiCMOS integrated circuits, where the wells are completely isolated by buried regions beneath the wells, this smart contact scheme may be advantageously used. The scope of the present invention is only limited by the claims appended hereto.

What is claimed is:

1. A method for forming a semiconductor device comprising:
   providing a substrate having a first conductivity type;
   forming a first source region in said substrate, said source region having a second conductivity type;
   forming a first drain region in said substrate, said first drain region having said second conductivity type and said first drain region being spaced from said first source region defining a first channel region therebetween;
   forming a second channel region of said second conductivity type in said substrate and abutting said first channel region;
   forming a second drain region of said first conductivity type abutting said second channel region; and
   forming a gate formed adjacent to said first and second channel regions, said gate controlling current between said first source and first drain regions and between said second drain region and said first channel region.

2. A method for forming a device as in claim 1 wherein said substrate is formed on an insulating layer.

3. A method for forming a device as in claim 2 wherein said substrate is electrically isolated from other components formed on said insulating layer.

4. A method for forming a device as in claim 3 wherein said substrate comprises a mesa structure.

5. A method for forming a device as in claim 1 wherein said substrate comprises crystalline silicon.

6. A method for forming a device as in claim 1 further comprising the step of connecting said second drain region to a reference potential.

7. A method for forming a device as in claim 1 further comprising the step of forming a dielectric layer interposed between said gate and said first and second channel regions.

8. The method of claim 1 wherein said second channel is disposed perpendicularly to said first channel.

9. The method of claim 1 wherein said step of forming a gate comprises the step of forming a T-shaped gate.

10. The method of claim 1 wherein said first conductivity type is P and said second conductivity type is N.

11. A method of forming a transistor structure comprising the steps of:
    providing a semiconductor layer having a first conductivity type;
    forming a first drain region in said semiconductor layer, said first drain region having a second conductivity type;
    forming a first source region in said semiconductive layer, said first source region having said second conductivity type, said first source region being separated from said first drain region by a first channel region;
    forming a second channel region having said second conductivity type in said semiconductive layer abutting said first channel region, said second channel disposed substantially perpendicularly to said first channel region;
    forming a second drain region in said semiconductive layer, said second drain region having said first conductivity type, said second drain region being separated from said first channel region by said second channel region; and
    forming a T-shaped gate on the surface of said semiconductive layer over said first and second channel regions such that a first potential applied to said gate causes said first channel region to be conductive and said second channel region to be non conductive and such that a second potential applied to said gate causes said second channel region to be substantially conductive and to couple said first channel region to a reference potential.

12. The method of claim 11 wherein said semiconductive layer is formed on an insulating layer.

13. The method of claim 12 wherein said insulating layer comprises silicon dioxide.

14. The method of claim 11 wherein said gate is separated from said first and second channel regions by a gate dielectric layer.

15. The method of claim 14 wherein said gate dielectric layer comprises silicon dioxide.

16. A method for forming a transistor structure comprising the steps of:
    providing a semiconductive layer having a first conductivity type;
    forming a first drain region in said semiconductive layer, said first drain region having a second conductivity type;
    forming a first source region in said semiconductive layer, said first source region having said second conductivity type, said first source region being separated from said first drain region by a first channel region;
    forming a second source region in said semiconductive layer, said second source region having said first conductivity type and said second source region abutting said first channel region;
    forming a second channel region having said second conductivity type in said semiconductive layer abutting said second source region, said second channel region disposed perpendicularly to said first channel region;

forming a second drain formed in said semiconductive layer, said second drain region having said first conductivity type, said second drain region being separated from said first channel region by said second channel region; and forming a T-shaped gate on the surface of said semiconductive layer over said first and second channel regions such that a first potential applied to said gate causes said first channel region to be conductive and said second channel region to be non conductive and such that a second potential applied to said gate causes said second channel region to be substantially conductive and to couple said first channel region to a reference potential.

17. The method of claim 16 wherein said step of providing semiconductor layer comprises forming a semiconductor layer overlying an insulating layer.

18. The method of claim 17 wherein said semiconductor layer comprises silicon.

19. The method of claim 18 wherein said insulating layer comprises silicon dioxide.

20. The method of claim 16 wherein said gate is separated from said first and second channel regions by a gate dielectric layer.

21. The method of claim 20 wherein said gate dielectric layer comprises silicon dioxide.

22. A method for forming a semiconductor device comprising:

providing a substrate having a first conductivity type;

forming a first source region in said substrate, said source region having a second conductivity type;

forming a first drain region in said substrate, said first drain region having said second conductivity type and said first drain region being spaced from said first source region defining a first channel region therebetween;

forming a second channel region of said second conductivity type in said substrate and abutting said first channel region said second channel disposed perpendicularly to said first channel region;

forming a second drain region of said first conductivity type abutting said second channel region; and forming a T-shaped gate formed adjacent to said first and second channel regions, said gate controlling current between said first source and first drain regions and between said second drain region and said first channel region.

* * * * *